United States Patent
Chang et al.

(10) Patent No.: US 6,171,717 B1
(45) Date of Patent: Jan. 9, 2001

(54) STRUCTURE OF STACKED BARRIER LAYER

(75) Inventors: Ting-Chang Chang, Hsinchu; Jung-Chih Hu, Kaohsiung Hsien, both of (TW)

(73) Assignee: United Microelectronics Corp., Hsinchu (TW)

(*) Notice: Under 35 U.S.C. 154(b), the term of this patent shall be extended for 0 days.

(21) Appl. No.: 09/181,303

(22) Filed: Oct. 28, 1998

(51) Int. Cl.⁷ .................................................. B32B 18/00

(52) U.S. Cl. ............................................................ 428/698

(58) Field of Search ............................................ 428/698

(56) References Cited

U.S. PATENT DOCUMENTS 5,236,868 * 8/1993 Nulman .................................. 437/190

* cited by examiner

*Primary Examiner*—Francis J. Lorin
(74) *Attorney, Agent, or Firm*—Thomas, Kayden, Horstemeyer & Risley

(57) ABSTRACT

A structure of a stacked barrier layer is provided. A first titanium layer is formed on a semiconductor substrate using plasma enhanced chemical vapor deposition (PECVD). At least a stacked barrier layer is formed on the first titanium layer. The stacked barrier layer includes a first titanium nitride layer and a plasma treated titanium nitride layer. The plasma treated titanium nitride layer is treated using a plasma gas including ammonia gas and nitrogen gas.

23 Claims, 5 Drawing Sheets

STRUCTURE OF STACKED BARRIER LAYER

BACKGROUND OF THE INVENTION

1. Field of the Invention

The invention relates in general to a structure of a stacked barrier layer in multilevel interconnects, and more particularly to a structure of a stacked titanium nitride barrier layer in multilevel interconnects.

2. Description of the Related Art

In the high density integrated circuit process titanium nitride is the most prevailing material for forming a barrier layer. The barrier layer is used for deterring the diffusion between alumnum and silicon to eliminate spiking and electromigration. In multilevel interconnect process, a barrier layer is preferrably composed of titanium nitride and titanium (TiN/Ti). A metal plug is composed of the barrier layer and alloys.

A conventional structure of a plug in multilevel interconnects is illustrated in FIG. 1. First, a semiconductor substrate 100 is provided and a source/drain region 101 is formed in the semiconductor substrate 100. A dielectric layer 102 is formed on the semiconductor substrate 100 to insulate metal layers. Photolithography process is performed to pattern the dielectric layer 102 and a contact opening 104 is formed in the dielectric layer 102 to expose the source/drain region 101. A titanium layer 106 is formed on the contact opening 104 using physical vapor deposition (PVD), for example, DC magnetron sputtering. The titanium layer 106 is about 200–1500 Å thick. A titanium nitride layer 108 is formed on the titanium layer 106 using physical vapor deposition (PVD). The titanium layer 109 is about 800–1200 Å thick. A plug 110 is formed in the contact opening 104. The method of forming the plug 110 is first depositing a metal layer, for example, alumnum to fill the contact opening 104 and etching back to form the plug 110. Then the wafer is cleaned for subsequent metal interconnects process.

FIG. 2 showing a columnar structure of the titanium nitride layer. There are spacings between the columnar titanium nitride grains. Aluminum metal can diffuse along the spacings to react with silicon. Therefore, the method to deter the diffusion between alumnum and silicon is to elongate or to turn the diffusion path from alumnum to silicon. However, as shown in FIG. 3, the physical vapor deposition (PVD) is no longer a good method to form a titanium nitride layer and can not match the need that the size of devices decrease. It is difficult to fill the Ti/TiN layer 118 in the contact window 104 with high aspect ratio by PVD because of its poor step coverage. Therefore, the leakage current increases.

SUMMARY OF THE INVENTION

It is an object of the invention to provide a structure of a stacked barrier layer using plasma enhanced chemical vapor deposition (PECVD) to provide good step coverage and to match the need that the size of devices decrease.

It is an object of the invention to provide a structure of a stacked barrier layer to eliminate the diffusion between alumnum and silicon, and to reduce leakage current of contact regions.

It is another object of the invention to provide a structure of a stacked barrier layer to reduce the diffusion from alumnum to silicon and to eliminate spiking and electromigration.

A structure of a stacked barrier layer is provided. A first titanium layer is formed on a semiconductor substrate using plasma enhanced chemical vapor deposition (PECVD). At least a stacked barrier layer is formed on the first titanium layer. The stacked barrier layer includes a first titanium nitride layer and a plasma treated titanium nitride layer. The first titanium layer is formed using PECVD in which the source gas includes about 1–10 sccm $TiCl_4$ and about 1000–300 sccm $H_2$, the RF power is about 100–500 W, the pressure is about 3–15 torr, and the temperature is about 570–650 °C. The first titanium nitride layer is formed on the first titanium layer using low pressure chemical vapor deposition (LPCVD) in which the source gas includes about 35–42 sccm $TiCl_4$, about 60–80 sccm ammonia gas and about 3000 sccm nitrogen gas, the pressure is about 10–30 torr and the temperature is about 570–650° C. The plasma treated titanium nitride layer is formed using first forming a second titanium layer on the first titanium nitride layer and treating the second titanium layer using a plasma gas to form the plasma treated titanium nitride layer. The second titanium layer is formed using plasma enhanced chemical vapor deposition (PECVD) in which the source gas includes about 1–10 sccm $TiCl_4$ and about 1000–3000 sccm $H_2$ gas, the RF power is about 100–500 W, the pressure is about 3–15 torr, and the temperature is about 570–650° C. When treating with plasma, the source gas includes about 1000–3000 sccm ammonia gas and about 1000–3000 sccm nitrogen gas, the plasma RF power is about 100–500 W and the temperature is about 570–650° C.

BRIEF DESCRIPTION OF THE DRAWINGS.

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1:
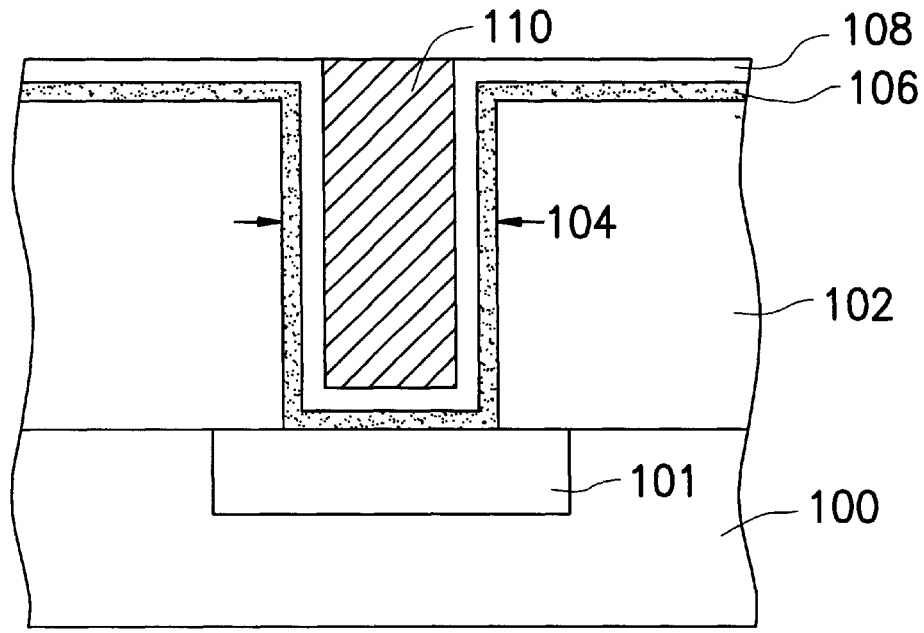
FIG. 1 is a cross-sectional view showing a conventional structure of a barrier layer in a plug.
Figure 2:
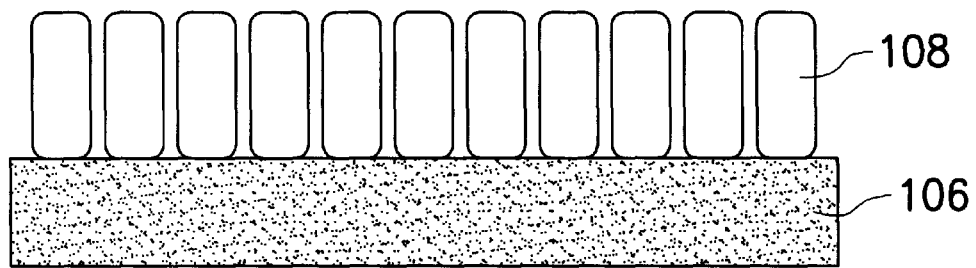
FIG. 2 is a cross-sectional view showing a structure of the titanium nitride layer in FIG. 1.
Figure 3:
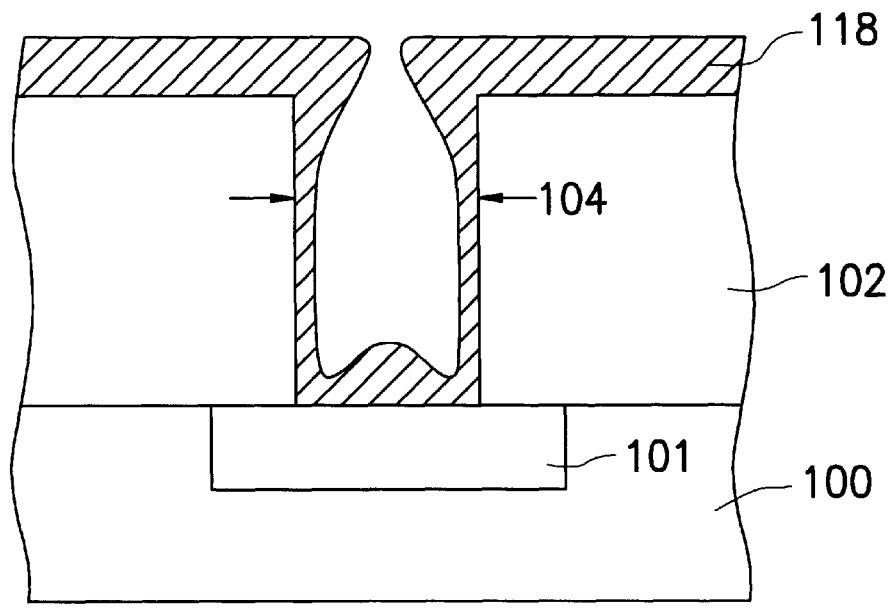
FIG. 3 is a cross-sectional view showing a conventional structure of a titanium nitride barrier layer in a plug by PVD.
Figure 4A:
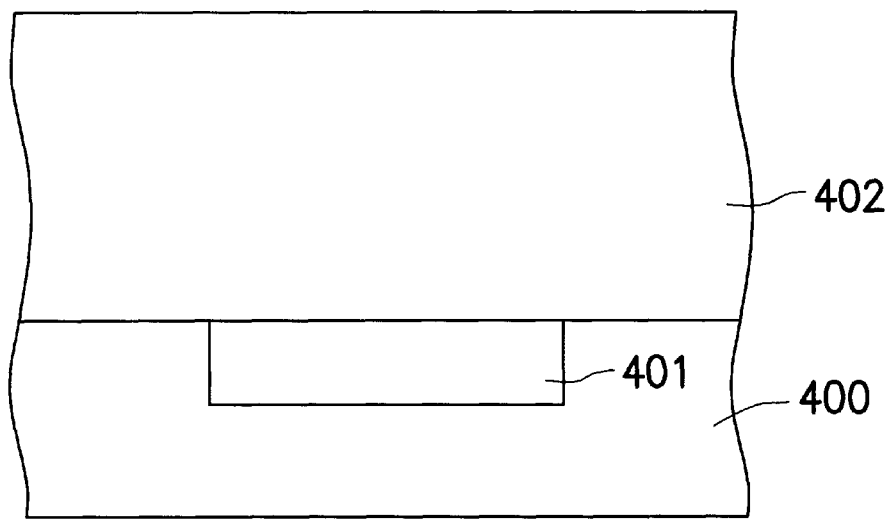
FIGS. 4A–4E are cross-sectional views showing a method of fabricating a stacked barrier layer according to the invention.

FIGS. 4A–4E are cross-sectional views showing a method of fabricating a stacked barrier layer according to the invention. First, as shown in FIG. 4A, a semiconductor substrate 400 is provided and a MOS device with a source/drain region 401 is formed on the semiconductor substrate 400. A dielectric layer 402 is formed on the semiconductor substrate 400 to insulate following metal layers. The dielectric layer 402 is about 8500 Å thick.

Figure 4B:
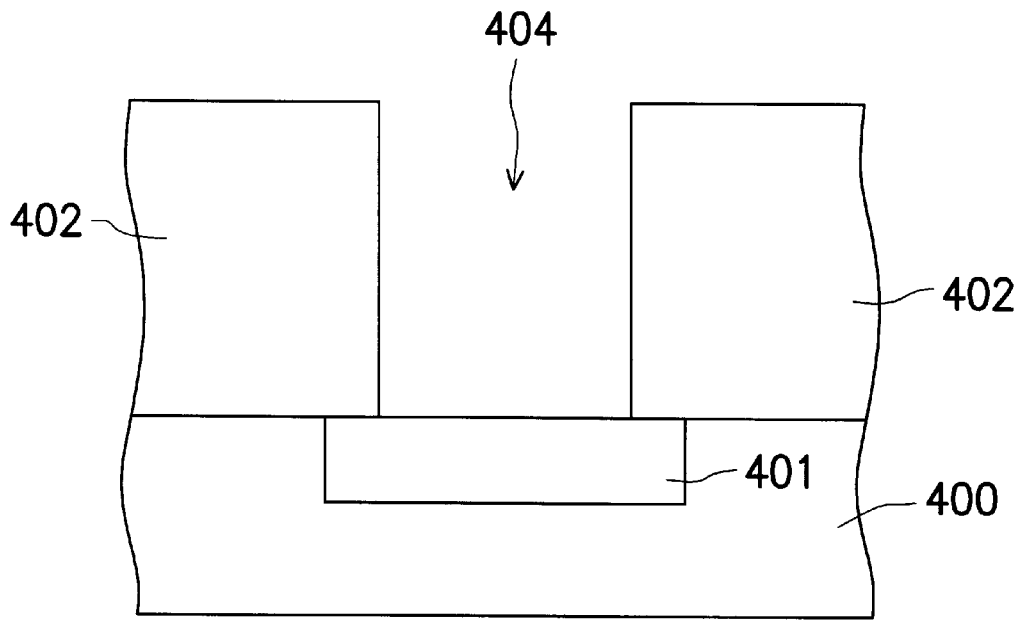

Next, as shown in FIG. 4B, a photolithography process is performed to pattern the dielectric layer 402. The photolithography process includes forming a photoresist layer on the dielectric layer 402, exposing the photoresist layer and developing the photoresist layer. Then the dielectric layer 402 is etched using the photoresist layer as a mask to form a contact opening 404. The contact opening 404 in the dielectric layer 402 exposes the source/drain region 401.

Figure 4C:
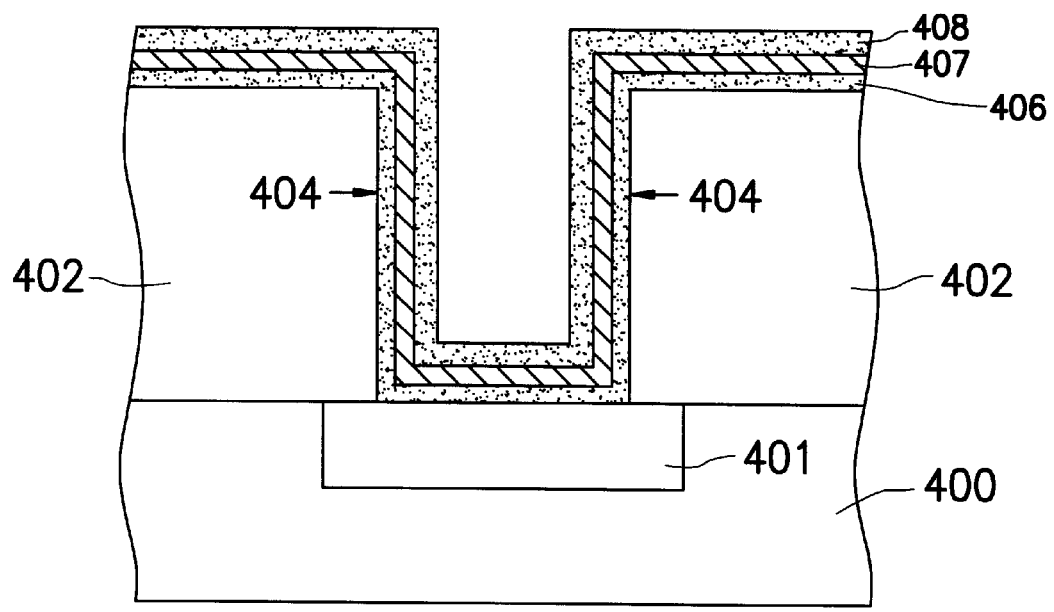

Next, as shown in FIG. 4C, the following process is performed to form a plug. A titanium layer 406 is formed in the contact opening 404 and on the dielectric layer 402 using chemical vapor deposition (CVD). A titanium nitride layer 407 is formed on the titanium layer 406 using, chemical vapor deposition (CVD). A titanium layer 408 is formed on the titanium nitride layer 407 using chemical vapor deposition (CVD). The titanium 406 and the titanium layer 408 are preferrably formed using plasma enhanced chemical vapor deposition (PECVD) in which the source gas includes about 1–10 sccm $TiCl_4$ and about 1000–3000 sccm $H_2$, the RF power is about 100–500 W, the pressure is about 1–15 torr and the temperature is about 570–650° C. The titanium layer 406 and the titanium layer 408 are about 100–1000 Å thick. The titanium nitride layer 407 is preferrably formed using low pressure chemical vapor deposition (LPCVD) in which the source gas includes about 35–49 sccm $TiCl_4$, about 60–80 sccm ammonia gas and about 3000 sccm nitrogen gas the pressure is about 10–30 torr and the temperature is about 570–650° C. The titanium nitride layer 407 is about 100–1000 Å thick.

Figure 4D:
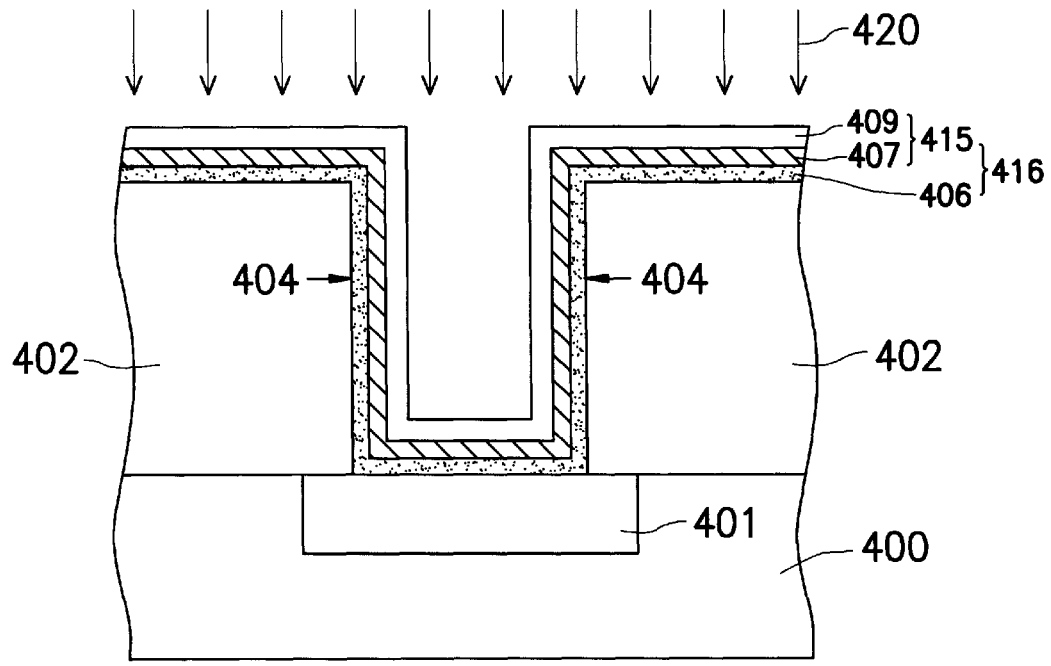

Next, as shown in FIG. 4D, gas plasma treating 420 is performed on the surface of the semiconductor substrate 400 to make the titanium layer 408 react with nitrogen to form a plasma titanium nitride layer 409. The titanium nitride layer 407 and the plasma titanium nitride layer 409 form a stacked layer 415. The titanium layer 406, the titanium nitride layer 407 and the plasma titanium nitride layer 409 form a multi-stacked layer 416. The method of plasma treating includes, for example, the source as including about 1000–3000 sccm ammonia gas and about 1000–3000 sccm nitrogen gas, the plasma RF power which is about 100–500 W and the temperature which is about 570–650° C.

Figure 4E:
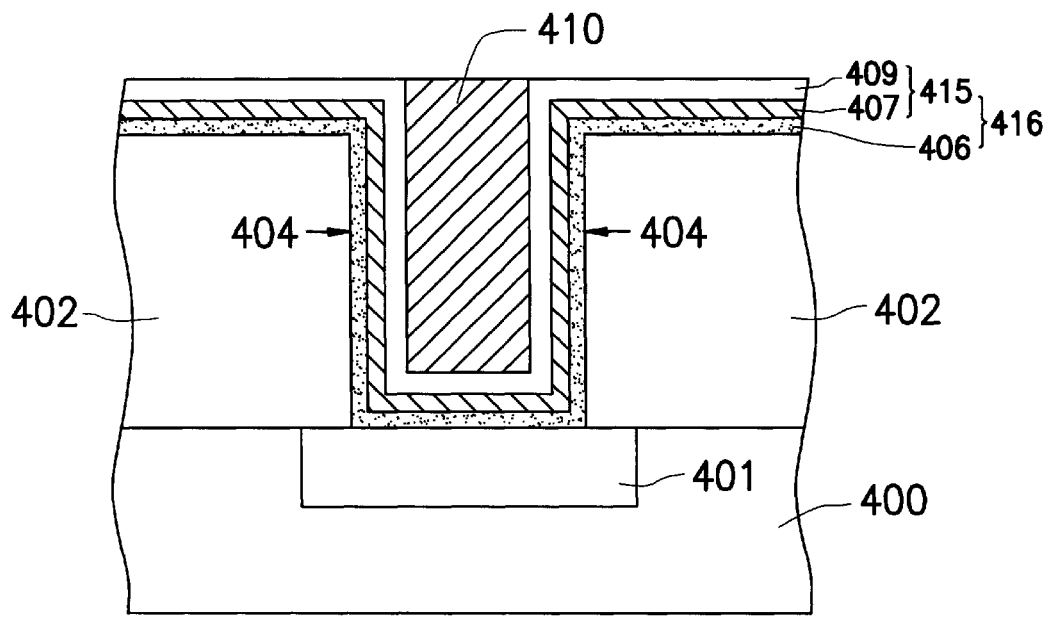

Next, as shown in FIG. 4E, a plug 410 is formed on the stacked barrier layer 416. The method o forming the plug 410 is first depositing a metal layer, for example, an alumnum layer to fill the contact opening 404 and etching back to form the plug 410. Then the wafer is cleaned for subsequent metal interconnects process.

Figure 5:
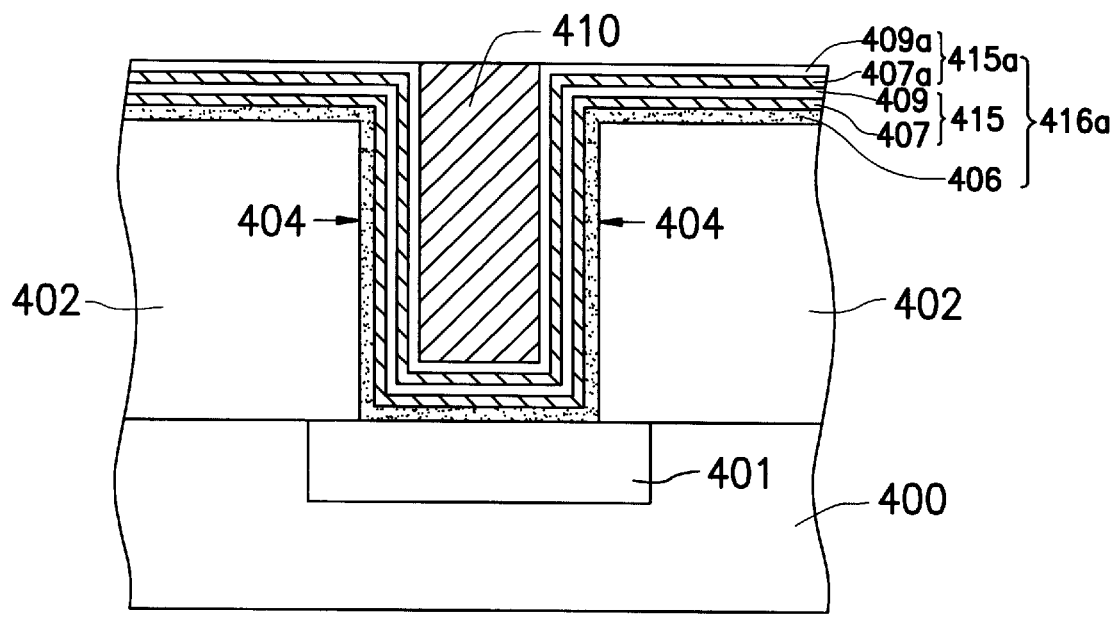
FIG. 5 is a cross-sectional view showing another structure of a stacked barrier layer according to the invention.

FIG. 5 is a cross-sectional view showing another method of fabricating a stacked barrier layer in a plug, according to the invention. The method is to form at least one more stacked barrier layer on the stacked barrier layer 416 in FIG. 4D. First, a titanium nitride layer 407a is formed on the plasma titanium nitride layer 409 using the same method of forming as that of titanium nitride layer 407. A plasma titanium nitride layer 409a is formed on the titanium nitride layer 407a using the same method of forming as that of titanium nitride layer 409. The titanium layer 406, the stacked layer 415, the titanium nitride layer 407a and the plasma titanium nitride layer 409a form a stacked barrier layer 416a. Then a alumnum layer is formed to fill the contact opening 404 and etched back to form a plug 410. The structure of the stacked barrier layer 416a in FIG. 5 can include more titanium nitride layers and plasma titanium nitride layers to elongate the diffusion path.

The structure of the stacked barrier layer of the invention has the following features:

1. According to the invention, the stacked barrier layer 416 in FIG. 4D includes the titanium layer 406, the titanium nitride layer 407 and the plasma titanium nitride layer 409. The titanium layer 406 is formed by PECVD. The titanium nitride layer 407 is formed by LPCVD. The plasma titanium nitride layer 409 is formed first by depositing the the titanium layer 408 and then plasma treating the surface of the titanium layer 408 to form a plasma titanium nitride layer 409. Both the titanium nitride layer 407 and the plasma titanium nitride layer 409 are columnar structures, and there are spacings between the columnar titanium nitride grains. The spacings of the titanium nitride layer and the spacings of the plasma titanium nitride layer alternate to elongate the diffusion path from alumnum to silicon. Therefore, the diffusion between alumnum and silicon is deterred and the leakage current of contact regions reduces.

Figure 6:
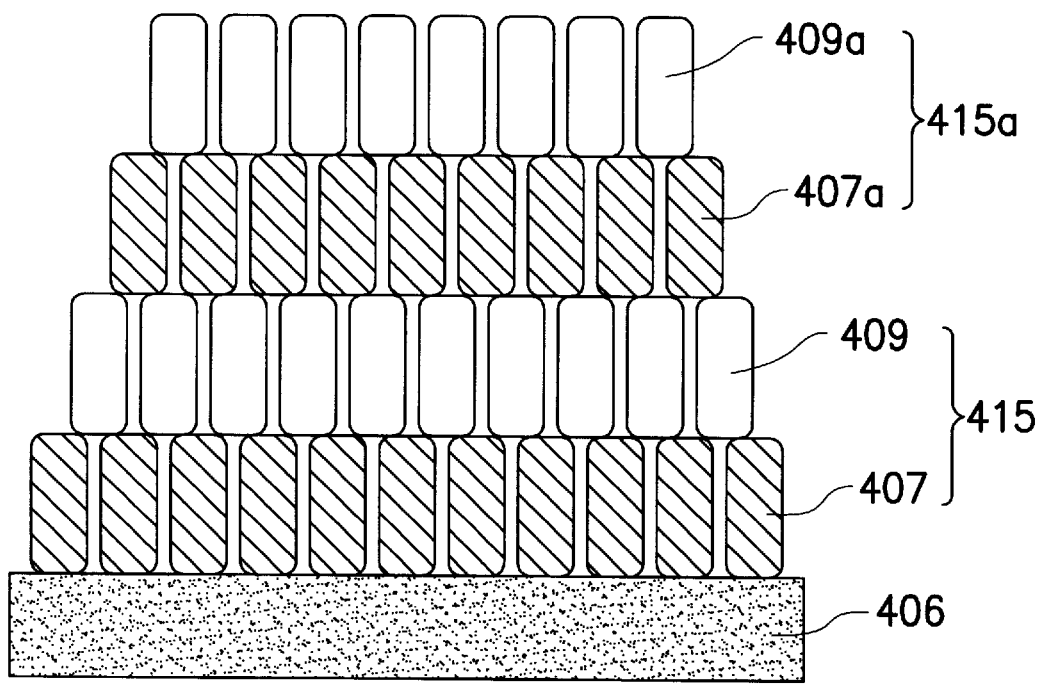
FIG. 6 is a cross-sectional view showing a columnar structure of a stacked barrier layer according to the FIG. 5 of the invention.

2. According to the invention, the multi-stacked barrier layer 416a in FIG. 6 includes at least the titanium nitride layer 407a, the plasma titanium nitride layer 409a on the stacked barrier layer 416 in FIG. 4D. Therefore, the structure of multi-stacked barrier layers elongates the diffusion path more.

While the invention has been described by way of example and in terms of preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications, similar arrangements and procedures.

What is claimed is:

1. A structure of a stacked barrier layer, comprising:
   a semiconductor substrate;
   a first titanium layer forming on the semiconductor substrate;
   a first titanium nitride layer forming on the first titanium layer; and
   a plasma treated titanium nitride layer forming on the first titanium nitride layer.

2. A structure as claimed in claim 1, further comprising:
   a second titanium nitride layer forming on the plasma treated titanium nitride layer; and
   a second plasma treated titanium nitride layer being treated using a plasma gas, forming on the second titanium nitride layer.

3. A structure as claimed in claim 1, wherein the first titanium layer is formed using chemical vapor deposition (CVD).

4. A structure as claimed in claim 1, wherein the first titanium layer is formed using plasma enhanced chemical vapor deposition (PECVD).

5. A structure as claimed in claim 4, wherein the first titanium layer is formed using plasma enhanced chemical vapor deposition (PECVD) in which the source gas includes about 1–11 sccm $TiCl_4$ and about 1000–3000 sccm $H_2$, the RF power is about 100–500 W, the pressure is about 3–15 torr, and the temperature is about 570–650° C.

6. A structure as claimed in claim 1, wherein the first titanium nitride layer is formed using low pressure chemical vapor deposition (LPCVD).

7. A structure as claimed in claim 6, wherein the first titanium nitride layer is about 1000–1000 Å thick and is formed using low pressure chemical vapor deposition (LPCVD) in which the source gas includes about 35–42 sccm $TiCl_4$, about 60–80 sccm ammonia gas and about 3000 sccm nitrogen gas, the pressure is about 10–30 torr and the temperature is about 570–650° C.

8. A structure as claimed in claim 1, wherein the method of fabricating the plasma treated titanium nitride layer comprising:
   forming a second titanium layer on the first titanium nitride layer; and treating the second titanium layer using a plasma gas to form the plasma treated titanium nitride layer.

9. A structure as claimed in claim 8, wherein the second titanium layer is formed using plasma enhanced chemical vapor deposition (PECVD).

10. A structure as claimed in claim 8, wherein the second titanium layer is formed using plasma enhanced chemical vapor deposition (PECVD) in which the source gas includes about 1–10 sccm $TiCl_4$ and about 1000–3000 sccm $H_2$ gas, the RF power is about 100–500 W, the pressure is about 3–15 torr and the temperature is about 570–650 ° C.

11. A Structure as claimed in claim 8, wherein the plasma gas includes ammonia gas and nitrogen gas.

12. A structure as claimed in claim 8, wherein when treating with plasma, the source gas includes about 1000–3000 sccm ammonia gas and about 1000–3000 sccm nitrogen gas, the plasma RF power is about 100–500 W and the temperature is about 570–650° C.

13. A structure of a stacked barrier layer, comprising:
    a semiconductor substrate;
        a first titanium layer forming on the semiconductor substrate, and
        at least a stacked barrier layer forming on the first titanium layer, the stacked barrier layer including a first titanium nitride layer and a plasma treated titanium nitride layer.

14. A structure as claimed in claim 13, wherein the first titanium layer is formed using chemical vapor deposition (CVD).

15. A structure as claimed in claim 13, wherein the first titanium layer is formed using plasma enhanced chemical vapor deposition (PECVD).

16. A structure as claimed in claim 13, wherein the first titanium layer is formed using plasma enhanced chemical vapor deposition (PECVD) in which the source gas includes about 1–10 sccm $TiCl_4$ and about 1000–3000 sccm $H_2$, the RF power is about 100–500 W, the pressure is about 3–15 torr and the temperature is about 570–650° C.

17. A structure as claimed in claim 13, wherein the first titanium nitride layer is formed using low pressure chemical vapor deposition (LPCVD).

18. A structure as claimed in claim 13, wherein the first titanium nitride layer is formed using low pressure chemical vapor deposition (LPCVD) in which the source gas includes about 35–42 sccm $TiCl_4$, about 60–80 sccm ammonia gas and about 3000 sccm nitrogen gas, the pressure is about 10–30 torr and the temperature is about 570–650° C.

19. A structure as claimed in claim 13, wherein the method of fabricating the plasma treated titanium nitride layer comprising:
    forming a second titanium layer on the first titanium nitride layer; and
    treating the second titanium layer using a plasma gas to form the plasma treated titanium nitride layer.

20. A structure as claimed in claim 19, wherein the second titanium layer is formed using plasma enhanced chemical vapor deposition (PECVD).

21. A structure as claimed in claim 19, wherein the second titanium layer is formed using plasma enhanced chemical vapor deposition (PECVD) in which the source gas includes about 1–10 sccm $TiCl_4$ and about 1000–3000 sccm $H_2$ gas, the RF power is about 100–500 W, the pressure is about 3–15 torr, and the temperature is about 570–650° C.

22. A structure as claimed in claim 19, wherein the plasma gas includes ammonia gas and nitrogen gas.

23. A structure as claimed in claim 19, wherein when treating with plasma, the source gas includes about 1000–3000 sccm ammonia gas and about 1000–3000 sccm nitrogen gas, the plasma RF power is about 100–500 W, and the temperature is about 570–650° C.

* * * * *